United States Patent
Jung

(10) Patent No.: US 7,102,369 B2
(45) Date of Patent: Sep. 5, 2006

(54) CONTACT PIN, CONNECTION DEVICE AND METHOD OF TESTING

(75) Inventor: Ky-Hyun Jung, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 49 days.

(21) Appl. No.: 10/807,140

(22) Filed: Mar. 24, 2004

(65) Prior Publication Data
US 2005/0030050 A1    Feb. 10, 2005

(30) Foreign Application Priority Data
Aug. 8, 2003  (KR) .................. 10-2003-0055032

(51) Int. Cl.
*G01R 31/02* (2006.01)
(52) U.S. Cl. .................................. 324/754
(58) Field of Classification Search ........ 324/158.1, 324/754, 756–758, 761–762, 765; 439/700, 439/824
See application file for complete search history.

(56) References Cited

U.S. PATENT DOCUMENTS 5,032,787 A * 7/1991 Johnston et al. .......... 324/761
5,045,780 A * 9/1991 Swart ...................... 324/754
5,818,248 A * 10/1998 St. Onge .................. 324/761
6,220,870 B1   4/2001 Barabi et al.
6,441,629 B1 * 8/2002 Khoury et al. ............ 324/757
6,464,511 B1 * 10/2002 Watanabe et al. ........... 439/66
6,586,956 B1 * 7/2003 Aldaz et al. ............... 324/758
6,685,492 B1 * 2/2004 Winter et al. .............. 439/219

FOREIGN PATENT DOCUMENTS

JP    62-146967    6/1987

* cited by examiner

*Primary Examiner*—Jermele Hollington
*Assistant Examiner*—Tung X. Nguyen
(74) *Attorney, Agent, or Firm*—Harness, Dickey & Pierce, P.L.C

(57) ABSTRACT

A contact pin a connection device, and a method of testing. The contact pin may include a barrel (for example, a cylindrical barrel) having a screw thread on an inside wall, a contact tip formed at an end of the barrel, a spring located inside the barrel and having an end connected to the contact tip, a plunger formed at the other end of the barrel and connected to the other end of the spring, and at least one screw moving together with the screw thread. The plunger and/or the contact tip may have at least one screw, moving together with the screw thread.

24 Claims, 5 Drawing Sheets

CONTACT PIN, CONNECTION DEVICE AND METHOD OF TESTING

BACKGROUND OF THE INVENTION

This application claims the benefit of priority of Korean Patent Application No. 2003-55032, filed on Aug. 8, 2003, in the Korean Intellectual Property Office, the disclosure of which is incorporated herein in its entirety by reference.

FIELD OF THE INVENTION

The present invention relates to a contact pin, a connection device, and a method of testing, and more particularly, to a contact pin, a connection device, and a method of testing a semiconductor device.

DESCRIPTION OF THE RELATED ART

A semiconductor device and a tester should be properly connected to test characteristics (for example, electrical characteristics) of a semiconductor device. A conventional connection unit for connecting a semiconductor device and a tester may include a socket board, a probe card, or a connector.

A socket board is generally used for testing a semiconductor package and a probe card is generally used for testing a semiconductor chip. A connector may be used for testing discrete devices.

The conventional connection units connect terminals of the semiconductor device to be tested and the tester and facilitate transmission and reception of electrical signals in both directions. Conventional connection units may include a pogo pin as a contact pin device of the connection unit. A conventional pogo pin has an internal spring such that it may smoothly connect a semiconductor device and a tester and may buffer mechanical shock occurring during a connection. A conventional pogo pin as described above, is often utilized in socket boards.

An example of prior art pogo pin technology may be found in U.S. Pat. No. 6,220,870, entitled "IC Chip Socket and Method."

FIGS. 1 and 2 are schematic cross-sectional views illustrating an expanded pogo pin in FIG. 1 and a contracted pogo pin in FIG. 2, according to the '870 patent.

Referring to FIGS. 1 and 2, the pogo pin 77 includes a cylinder-type barrel 95 acting as a body of the pogo pin, a contact tip 91 formed at an end of the barrel 95, a spring 97 connected to the contact tip inside the barrel 95, and a plunger 79 that moves up and down as a piston and is connected to the spring 97 at the other end of the barrel 97 opposite the contact tip 91.

The plunger 79 and the contact tip 91 electrically connect a connection terminal of a semiconductor device and a tester through the expansion and contraction of the spring 97.

However, the plunger 79 and the contact tip 91, which are the parts connected to the semiconductor device and the tester, move up and down via expansion and contraction of the spring 97, and thus, it may be difficult to maintain constant contact pressure.

Further, if the semiconductor device is a semiconductor package with a connection terminal plated with tin and solder, flakes or fragments of tin and solder may be absorbed into the plunger 79 and the contact tip 91 may cause a short with nearby pogo pins during testing. In addition, the flakes may reduce the lifetime of the pogo pin due to mechanical damage occurring to the pogo pin when removing the flakes.

SUMMARY OF THE INVENTION

Exemplary embodiments of the present invention provide a contact pin, a connection device, and a method of testing. Exemplary embodiments of the present invention provide a contact pin, a connection device, and a method of testing a semiconductor device.

An exemplary embodiment of the contact pin may include a barrel (for example, a cylindrical barrel) having a screw thread on an inside wall, a contact tip formed at an end of the barrel, a spring located inside the barrel and having an end connected to the contact tip, a plunger formed at the other end of the barrel and connected to the other end of the spring, and at least one screw moving together with the screw thread.

In exemplary embodiments, the at least one screw is connected to the plunger and the plunger rotates and moves up and down simultaneously.

In exemplary embodiments, the at least one screw is connected to the contact tip and the contact tip rotates and moves up and down simultaneously.

In exemplary embodiments, at least one screw is connected to the plunger and the plunger rotates and moves up and down simultaneously and at least one screw is connected to the contact tip and the contact tip rotates and moves up and down simultaneously.

In exemplary embodiments, the contact pin may be electrically connected to a probe, a socket board, or a connector.

In exemplary embodiments, the plunger may have a crown-type tip or a straight-line tip.

In exemplary embodiments, the contact pin may be a pogo pin used in an apparatus for testing a semiconductor device.

Another exemplary embodiment of the present invention provides a method for testing a semiconductor device including providing a tester capable of performing an electrical test on the semiconductor device, providing a connection unit for electrically connecting the semiconductor device and the tester, providing a connection unit, including at least one contact pin, for electrically connecting the semiconductor device and the tester, electrically connecting the tester and the semiconductor device via a simultaneous rotating and up and down movement of the at least one contact pin, and performing an electrical test on the semiconductor device.

Another exemplary embodiment of the present invention provides a connection unit for testing characteristics of a semiconductor device, comprising at least one contact pin including, a barrel having a screw thread on an inside wall, a contact tip formed at an end of the barrel, a spring located inside the barrel and having an end connected to the contact tip, a plunger formed at the other end of the barrel and connected to the other end of the spring, and at least one screw moving together with the screw thread.

By adding at least one screw to the contact pin (for example, to the plunger and/or the contact tip) and changing the contact movement from an up and down movement to a combination of rotation and up and down movement, the exemplary embodiments of the present invention may bring the following advantages: equally maintaining contact pressure; reducing an amount of flakes that are absorbed; enhancing an electrical connection state; and/or lengthening the life span of the contact pin.

BRIEF DESCRIPTION OF THE DRAWINGS

Various features of the present invention will become readily apparent by from the description of the exemplary embodiments that follows, with reference to the attached drawings in which.

DETAILED DESCRIPTION OF EXEMPLARY EMBODIMENTS OF THE INVENTION

Exemplary embodiments of the present invention will now be described more fully with reference to the attached drawings, in which exemplary embodiments of the invention are shown.

Figure 1:
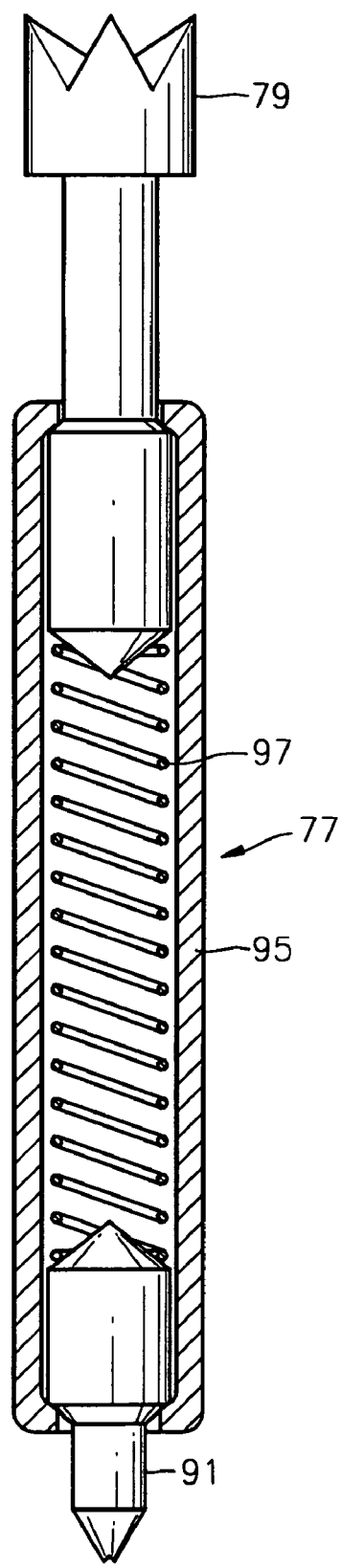
FIG. 1 is a cross-sectional view of a prior art pogo pin.
Figure 2:
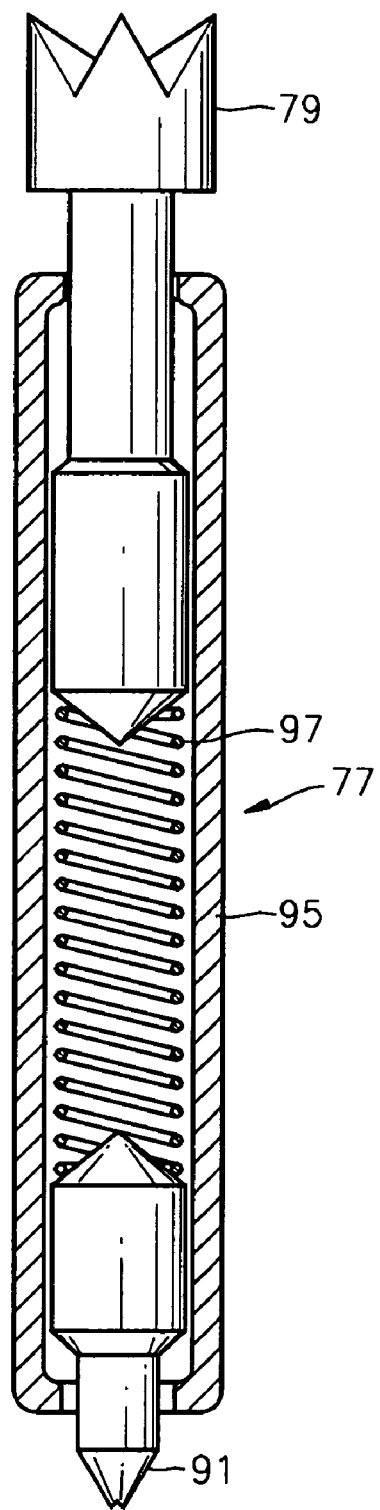
FIG. 2 is a cross-sectional view illustrating a prior art pogo pin in which a spring for connection is contracted.
Figure 3:
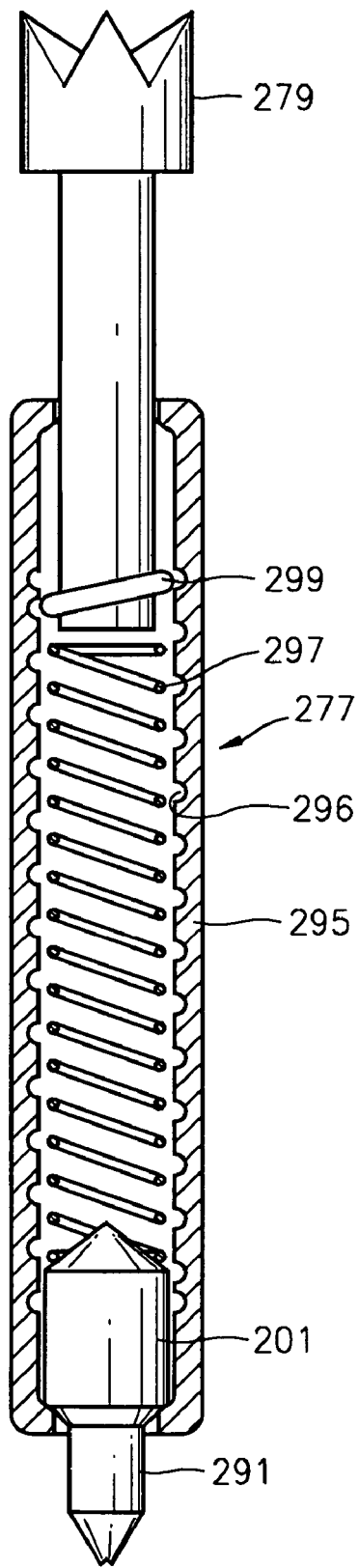
FIG. 3 is a cross-sectional view illustrating a pogo pin according to an exemplary embodiment of the present invention.

FIG. 3 is a cross-sectional view illustrating a pogo pin used in an apparatus for testing a semiconductor device according to an exemplary embodiment of the present invention.

Referring to FIG. 3, the pogo pin 277 includes a hollow, cylindrical barrel 295 used as a body of the pogo pin, a contact tip 291 formed at an end of the barrel 295, a spring 297 connected to the contact tip inside the barrel 295, and a plunger 279 connected to the other end of the barrel 295 opposite the contact tip 291. Screw threads 296 are provided on an inner wall of the barrel 295 and a screw 299 is provided on a portion of the plunger 279 where the plunger 279 is connected to the spring 297. The screw 299 moves within the screw threads 296.

The plunger 279 may rotate and perform up and down movements simultaneously by operation of the screw threads 296 and the screw 299 according to an exemplary embodiment of the present invention. Thus, the plunger 279 may contact a lead of the semiconductor device or a pad of a semiconductor chip with more constant pressure. In exemplary embodiment of the present invention, a buffer effect may also be obtained.

The pogo pin 277 conducting the above contact movements may be used in any kind of connection unit to connect a semiconductor device and a tester. The connection unit may include a probe card used in an electrical die sort (EDS) of a wafer, a socket board used in an electrical test of a semiconductor package, and a connector used to electrically test an individual device such as a semiconductor device.

Figure 4:
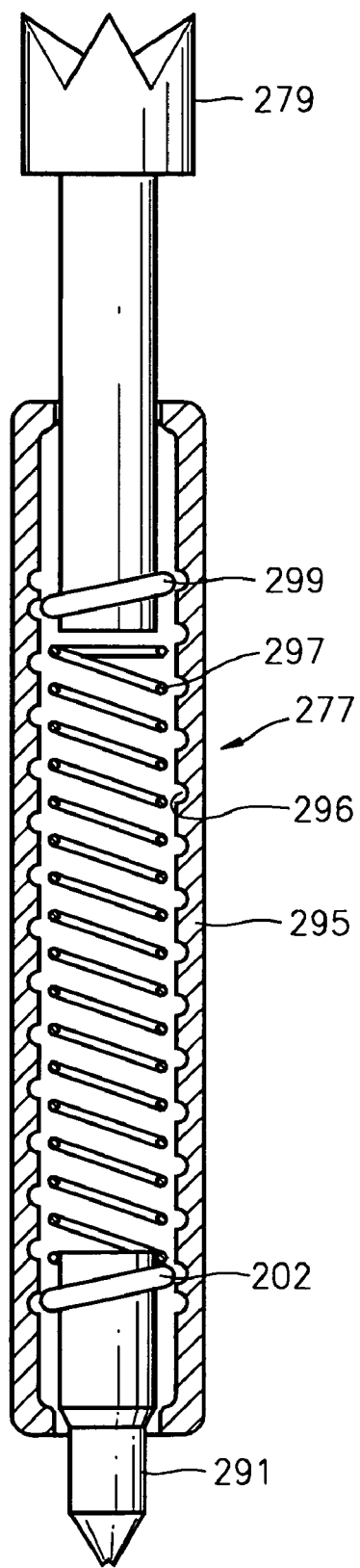
FIG. 4 is a cross-sectional view illustrating a pogo pin according to another exemplary embodiment of the present invention.

FIG. 4 is a cross-sectional view illustrating a pogo pin according to another exemplary embodiment of the present invention.

Referring to FIG. 4, screw 202 may be provided instead of, or in an area other than where the screw 299 is provided, for example, where the spring 297 and the contact tip 291 are connected. Therefore, the plunger 279 and the contact tip 291 may rotate and move up and down simultaneously when the pogo pin 277 moves. It is noted that more screws in more places in the same or different threads could also be added as would be known to one of ordinary skill in the art.

Accordingly, an electrical connection is made by friction among the tip of the plunger 279 and the contact tip 291, and their respective contacting parts by rotations of the screws 299 and 202 and the screw threads 296. Therefore, electrical connection may be more easily obtained even if a native oxide film decreasing conductivity exists in the contacting parts. Moreover, although flakes may be absorbed, they may be removed by frictional rotation. Thus, the flakes that may cause mechanical damage to the pogo pin 277 may not need to be removed frequently, and accordingly, the life span of the pogo pin 277 may be increased. As discussed above, the contact tip 291 may be connected to a tester.

Figure 5:
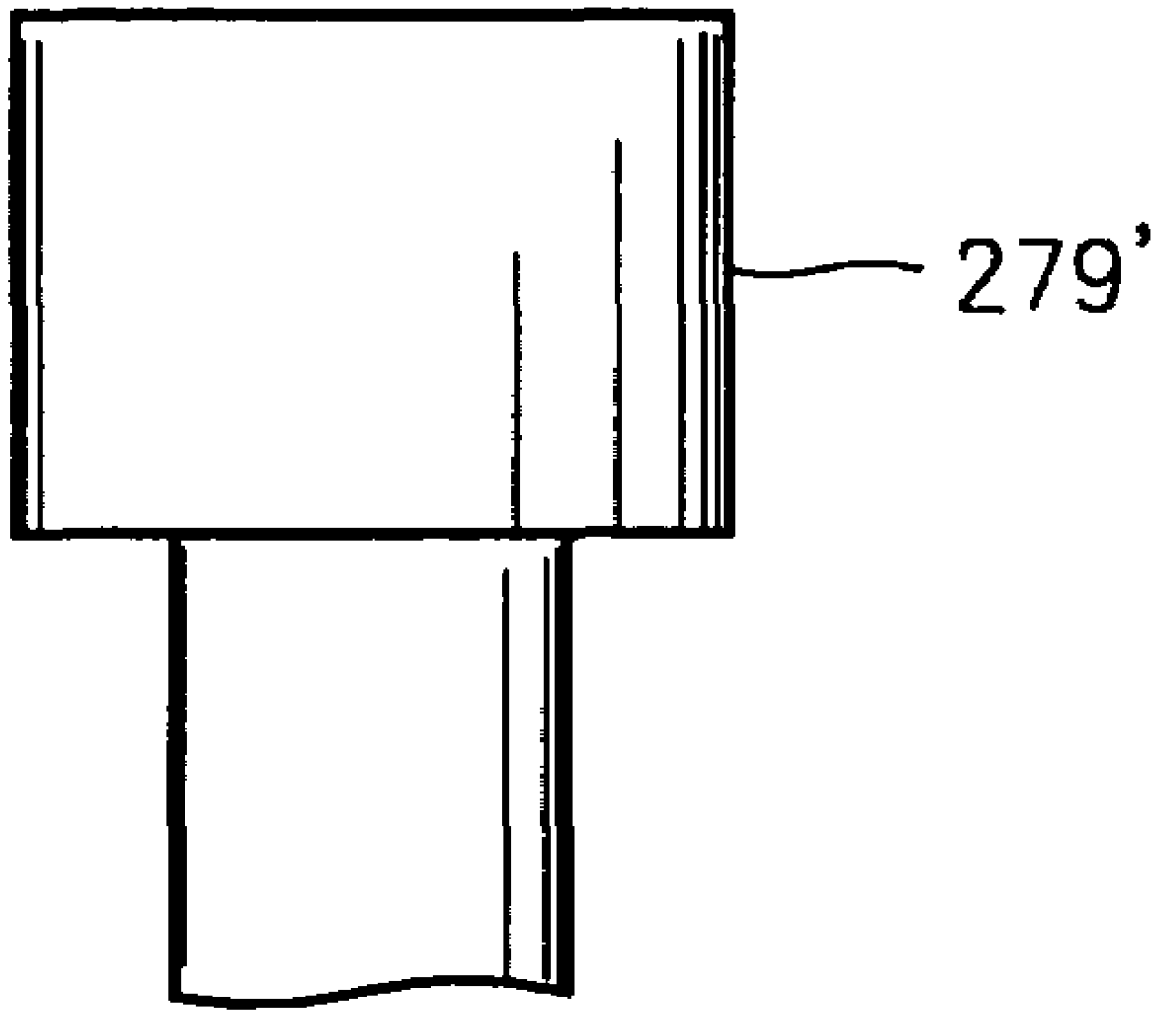
FIG. 5 is an exemplary cross-sectional view illustrating a transformational example of a plunger tip in FIGS. 3 and 4.

FIG. 5 is a cross-sectional view illustrating an example of a plunger tip in FIGS. 3 and 4. Referring to FIGS. 3 and 4, a tip of the plunger 279 has a crown type with protrusions so as to easily establish electrical contact between the tip of the plunger 279 and the lead of the semiconductor package. Referring to FIG.5, a straight-line type plunger tip 279' may also be used since the plunger tip 279 may rotate while moving up and down according to exemplary embodiments of the present invention. A straight-line type plunger tip 279' may further reduce the likelihood of flakes attaching to the plunger tip surface.

A method of testing a semiconductor device having the pogo pin will be explained with reference to FIG. 4.

A semiconductor device and a tester capable of conducting an electrical test on the semiconductor device are provided. The semiconductor device may be a semiconductor chip, semiconductor package, or an individual device. The semiconductor device and tester are electrically connected by using a connection unit having pogo pins according to exemplary embodiments of the present invention. The connection unit may include a probe card, a socket board, or a connector. An electrical test is conducted with respect to the semiconductor device.

A feature of the operating method of the connection unit for testing the semiconductor device according to an exemplary embodiment of the present invention lies in a contact method of the pogo pin connecting the semiconductor device and the tester, where the pogo pin rotate and moves up and down simultaneously rather than solely moving up and down.

Accordingly, as described above, the combination of rotation and up and down movement may have several advantages. First, a more constant contact pressure may be on the pogo pin. Second, the amount of flakes absorbed into the plunger and contact tip of the pogo pin may be reduced. Third, the electrical connection may be improved and the occurrence of a short may be decreased. Fourth, the life span of the pogo pin may be increased since less frequent removal of the flakes may be necessary.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A contact pin used in an apparatus for testing characteristics of a semiconductor device, the contact pin comprising:
   a barrel having a screw thread on an inside wall;
   a contact tip formed at an end of the barrel;
   a spring located inside the barrel and having an end connected to the contact tip;
   a plunger formed at the other end of the barrel and connected to the other end of the spring; and
   at least one screw moving together with the screw thread.

2. The contact pin of claim 1, wherein the at least one screw is connected to the plunger and the plunger rotates and moves up and down simultaneously.

3. The contact pin of claim 1, wherein the plunger has a tip electrically connected to a tester.

4. The contact pin of claim 3, wherein a tip of the plunger is a crown type.

5. The contact pin of claim 3, wherein the tip of the plunger is a straight-line type.

6. The contact pin of claim 1, wherein the contact tip is electrically connected to the semiconductor device through a probe card.

7. The contact pin of claim 1, wherein the contact tip is electrically connected to the semiconductor device through a socket board.

8. The contact pin of claim 1, wherein the contact tip is electrically connected to the semiconductor device through a connector.

9. The contact pin of claim 1, wherein the at least one screw is connected to the contact tip and the contact tip rotates and moves up and down simultaneously.

10. The contact pin of claim 9, wherein at least one screw is connected to the plunger and the plunger rotates and moves up and down simultaneously and at least one screw is connected to the contact tip and the contact tip rotates and moves up and down simultaneously.

11. The contact pin of claim 1, wherein said contact pin is a pogo pin.

12. The contact pin of claim 1, wherein said contact pin is part of a connection unit.

13. The contact pin of claim 1, wherein said contact pin is used in an apparatus for testing electrical characteristics of the semiconductor device.

14. The contact pin of claim 1, wherein the at least one screw is moveable relative to the screw thread.

15. The contact pin of claim 1, wherein the spring is interposed between the contact tip and the at least one screw.

16. A method for testing electrical characteristics of a semiconductor device, the method comprising:
    providing a tester capable of performing an electrical test on the semiconductor device;
    providing a connection unit, including at least one contact pin, for electrically connecting the semiconductor device and the tester, the at least one contact pin including a barrel having a screw thread on an inside wall, a plunger with at least one screw coupled to the screw thread, and a contact tip supported by the barrel;
    electrically connecting the tester and the semiconductor device via a simultaneous rotating and up and down movement of the at least one contact pin during which the at least one screw moves relative to the screw thread; and
    performing an electrical test on the semiconductor device.

17. The method of claim 16, wherein electrically connecting the semiconductor device and tester further includes connecting the contact tip to the semiconductor device through a probe card and connecting the plunger to the tester.

18. The method of claim 16, wherein electrically connecting the semiconductor device and the tester further includes connecting the contact tip to the semiconductor device through a socket board and connecting the plunger to the tester.

19. The method of claim 16, wherein electrically connecting the semiconductor device and the tester further includes connecting the contact tip to the semiconductor device through a connector and connecting the plunger to the tester.

20. A connection unit for testing characteristics of a semiconductor device, comprising:
    at least one contact pin including,
    a barrel having a screw thread on an inside wall;
    a contact tip formed at an end of the barrel,
    a spring located inside the barrel and having an end connected to the contact tip,
    a plunger formed at the other end of the barrel and connected to the other end of the spring; and
    at least one screw moving together withh the screw thread.

21. The connection unit of claim 20, wherein said contact pin is a pogo pin.

22. The connection unit of claim 20, wherein said contact pin is used in an apparatus for testing electrical characteristics of the semiconductor device.

23. The connection unit of claim 20, wherein the at least one screw is moveable relative to the screw thread.

24. The connection unit of claim 20, wherein the spring is interposed between the contact tip and the at least one screw.

* * * * *